United States Patent
Kobayashi et al.

(10) Patent No.: US 10,522,227 B2
(45) Date of Patent: Dec. 31, 2019

(54) SEMICONDUCTOR MEMORY DEVICE APPLYING DIFFERENT VOLTAGES TO RESPECTIVE SELECT GATE LINES

(71) Applicant: Toshiba Memory Corporation, Minato-ku (JP)

(72) Inventors: Takashi Kobayashi, Yokohama (JP); Yoichi Minemura, Yokkaichi (JP); Eietsu Takahashi, Yokohama (JP); Masaki Kondo, Yokkaichi (JP); Daisuke Hagishima, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/916,404

(22) Filed: Mar. 9, 2018

(65) Prior Publication Data

US 2019/0088331 A1    Mar. 21, 2019

(30) Foreign Application Priority Data

Sep. 19, 2017   (JP) ................... 2017-178814

(51) Int. Cl.
  *G11C 16/04*    (2006.01)
  *H01L 27/11529* (2017.01)
  *G06F 3/06*     (2006.01)
  *G11C 16/08*    (2006.01)
  *G11C 16/16*    (2006.01)
       (Continued)

(52) U.S. Cl.
  CPC ........ *G11C 16/0433* (2013.01); *G06F 3/0614* (2013.01); *G06F 3/0652* (2013.01); *G11C 11/5628* (2013.01); *G11C 11/5635* (2013.01); *G11C 11/5642* (2013.01); *G11C 16/0483* (2013.01); *G11C 16/08* (2013.01); *G11C 16/10* (2013.01); *G11C 16/16* (2013.01);
       (Continued)

(58) Field of Classification Search
  CPC .................................. G11C 16/0433
  USPC ..................................... 365/185.17
  See application file for complete search history.

(56) References Cited

U.S. PATENT DOCUMENTS

2006/0050559 A1* 3/2006 Sakui ............... H01L 27/115
                                                365/185.17
2008/0239822 A1  10/2008 Kosaki et al.
       (Continued)

FOREIGN PATENT DOCUMENTS

| JP | 2008-84471  | 4/2008 |
| JP | 2008-103019 | 5/2008 |
| JP | 2014-2810   | 1/2014 |

*Primary Examiner* — Hoai V Ho
(74) *Attorney, Agent, or Firm* — Oblon, McClelland, Maier & Neustadt, L.L.P.

(57) ABSTRACT

According to one embodiment, a semiconductor memory device includes: a memory string including first and second select transistors and memory cell transistors; a bit line connected to the first select transistor; word lines which are connected to gates of the memory cell transistors, respectively; first and second select gate lines which are connected to gates of the first and second select transistors, respectively; a first contact plug connected to the first select gate line; a first wiring layer provided on the first contact plug; a second contact plug connected to the second select gate line; a second wiring layer provided on the second contact plug; and a row decoder connected to the first and second wiring layers. The row decoder applies different voltages to the first select gate line and the second select gate line.

7 Claims, 14 Drawing Sheets

(51) Int. Cl.
  *G11C 11/56* (2006.01)
  *G11C 16/28* (2006.01)
  *G11C 16/24* (2006.01)
  *G11C 16/10* (2006.01)
  *G11C 16/32* (2006.01)

(52) U.S. Cl.
  CPC .............. *G11C 16/24* (2013.01); *G11C 16/28* (2013.01); *G11C 16/32* (2013.01); *H01L 27/11529* (2013.01)

(56) References Cited

U.S. PATENT DOCUMENTS

| | | | |
|---|---|---|---|
| 2013/0163325 A1* | 6/2013 | Noh | G11C 16/10 365/185.02 |
| 2013/0201758 A1* | 8/2013 | Kim | G11C 16/0483 365/185.2 |
| 2013/0336056 A1 | 12/2013 | Maeda | |
| 2017/0263638 A1* | 9/2017 | Okada | H01L 23/5226 |

* cited by examiner

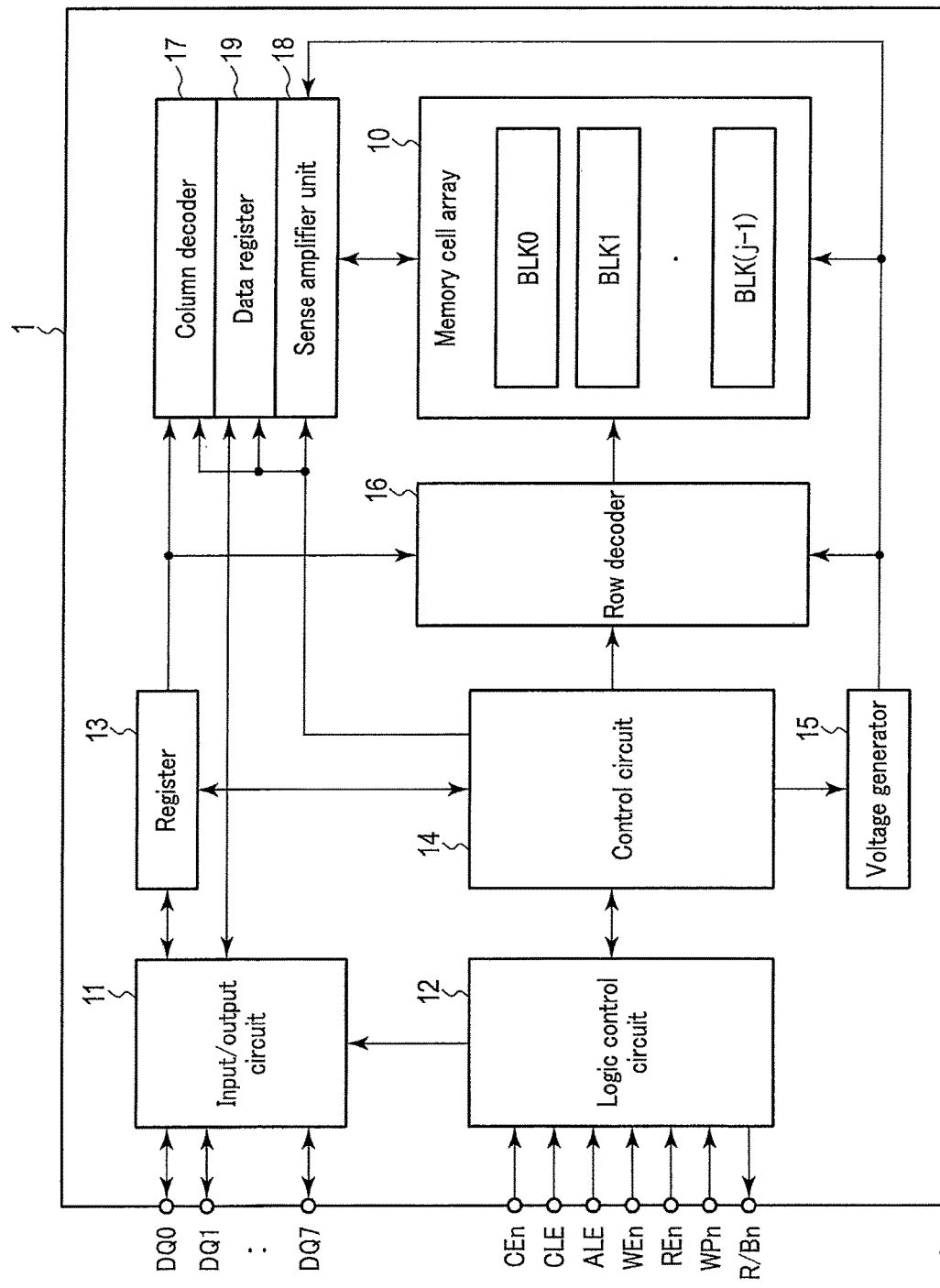
F I G. 1

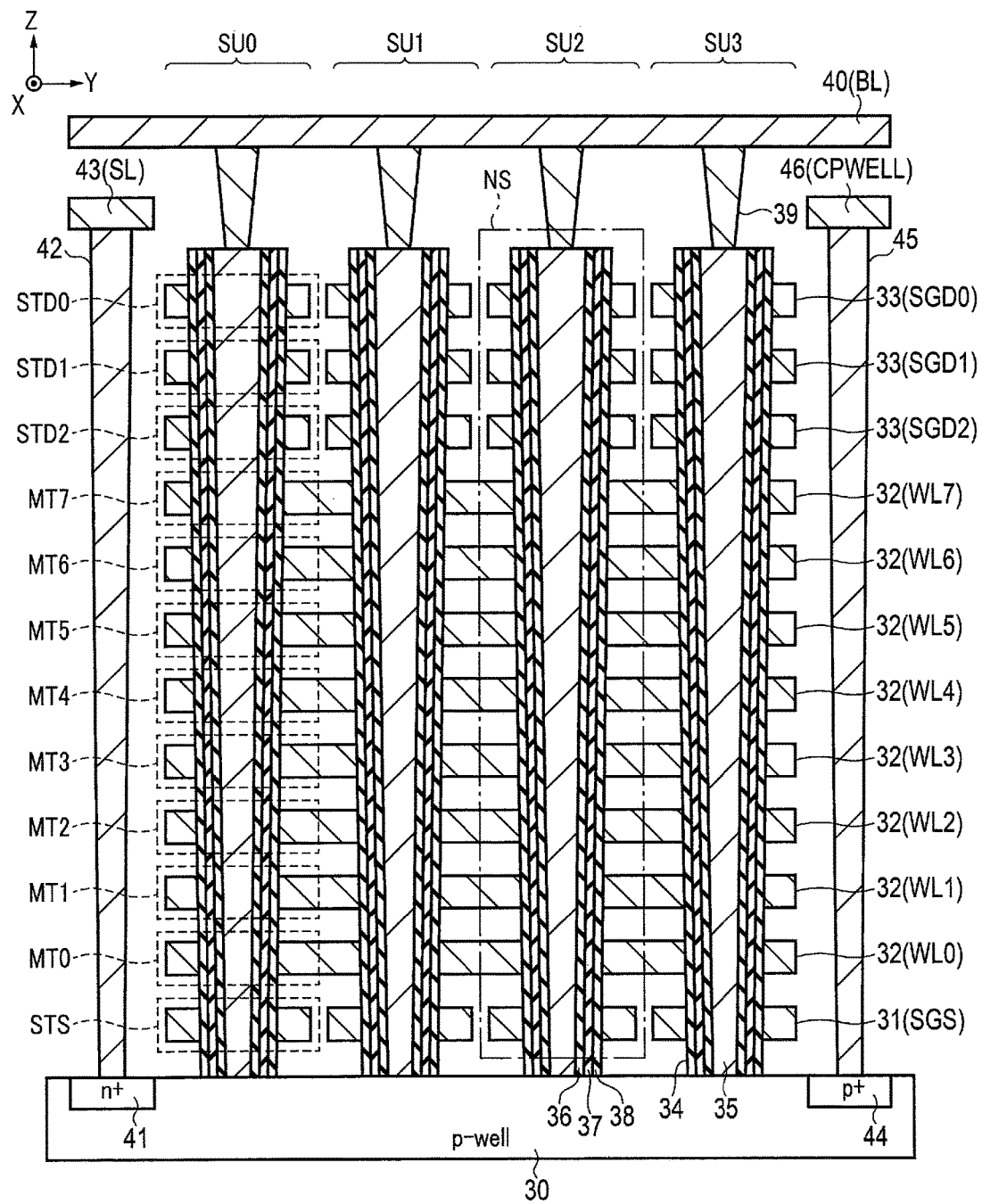
F I G. 3

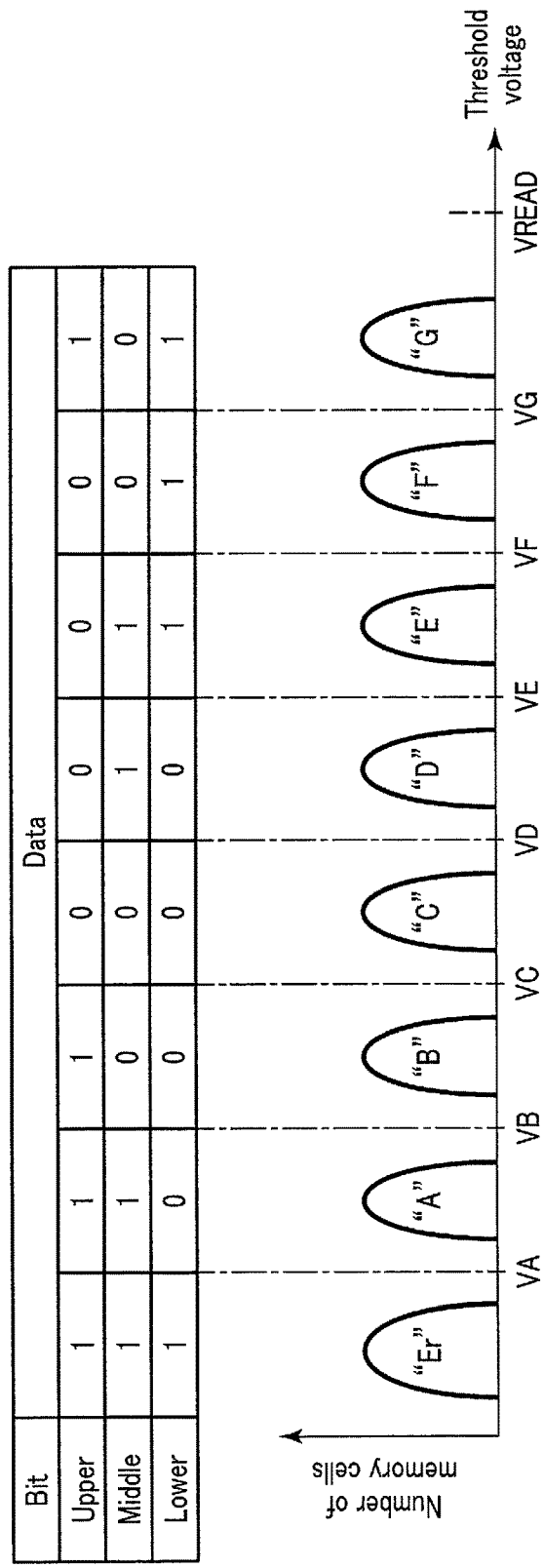
F I G. 5

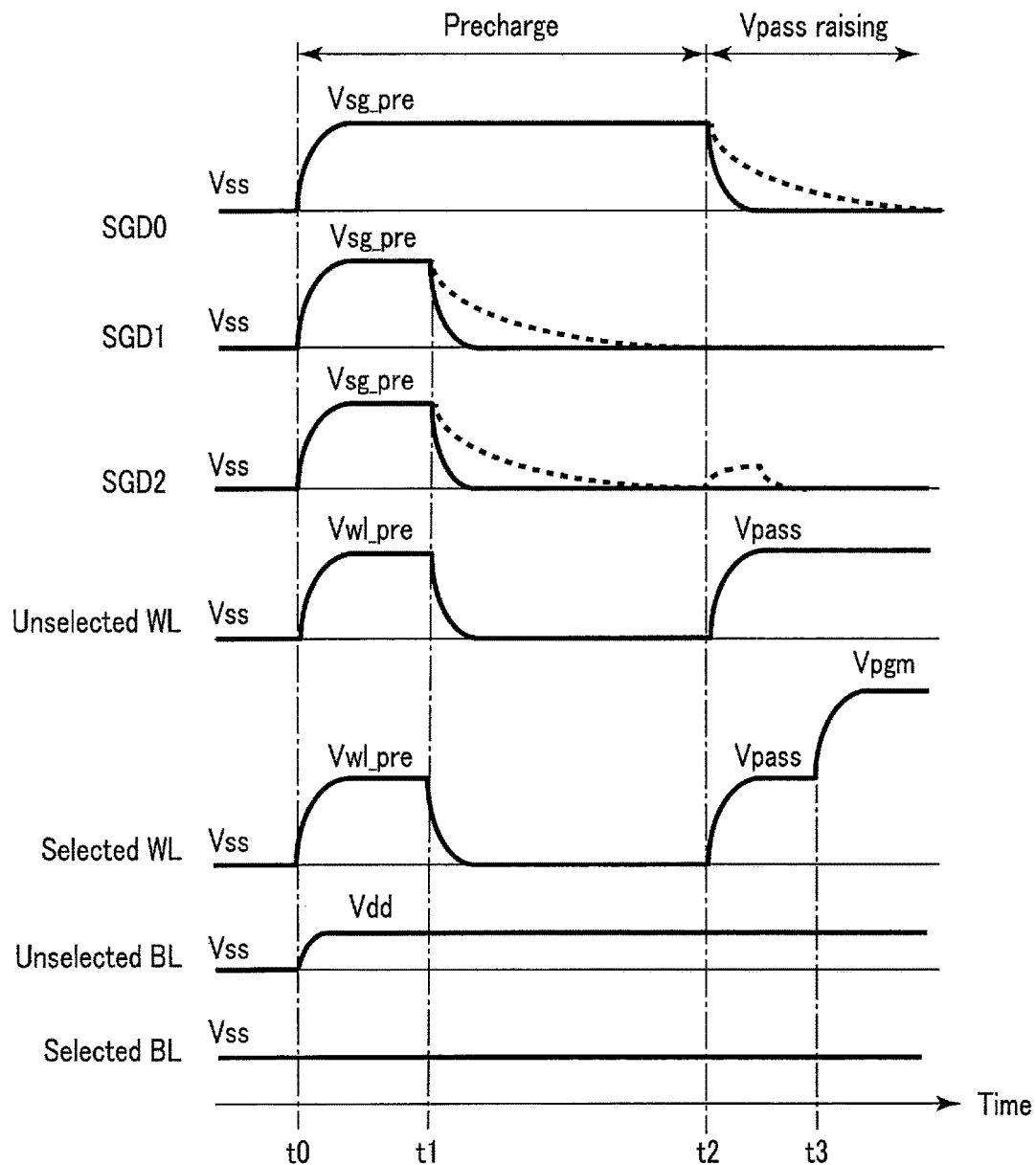
F I G. 6

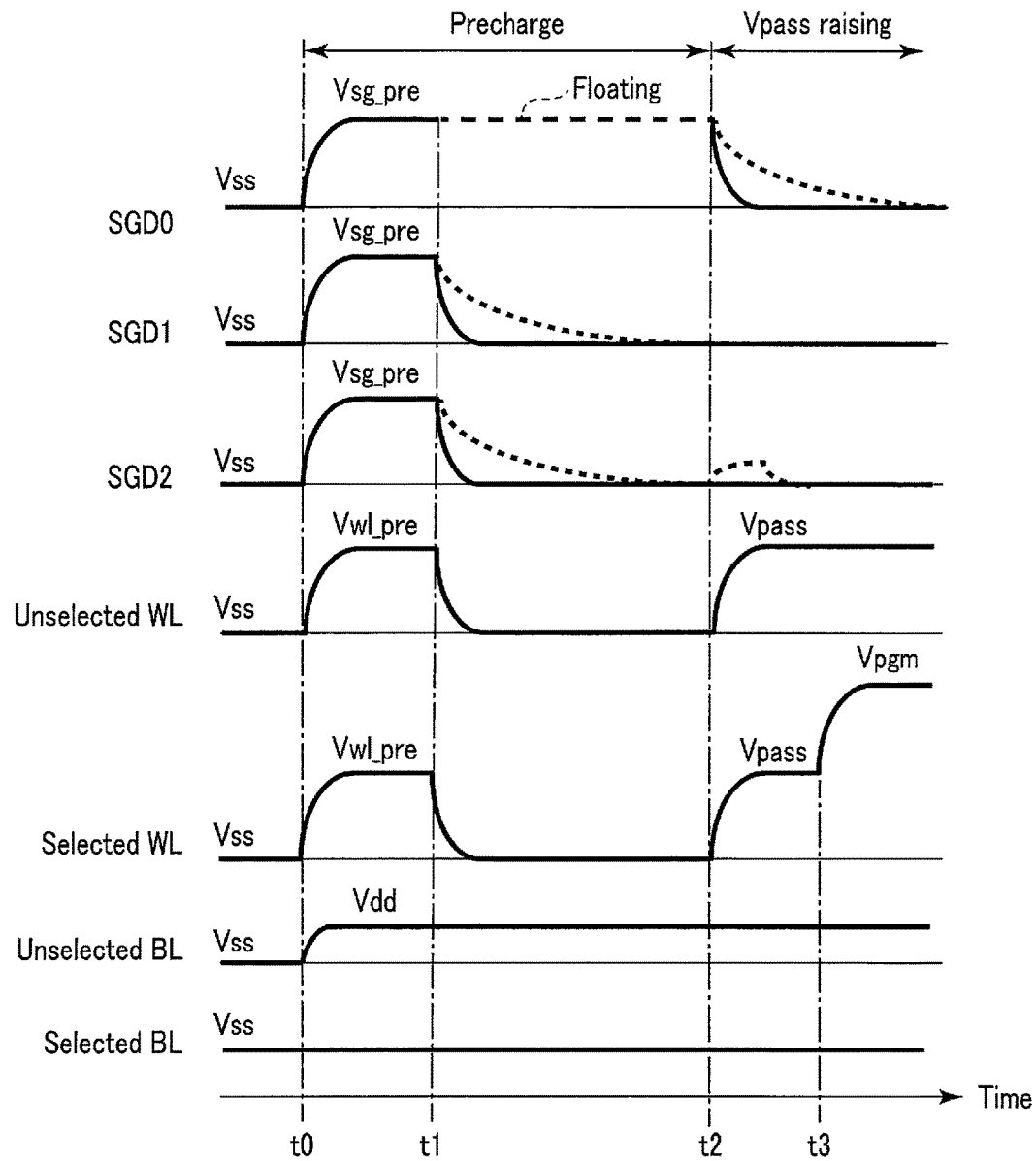
F I G. 7

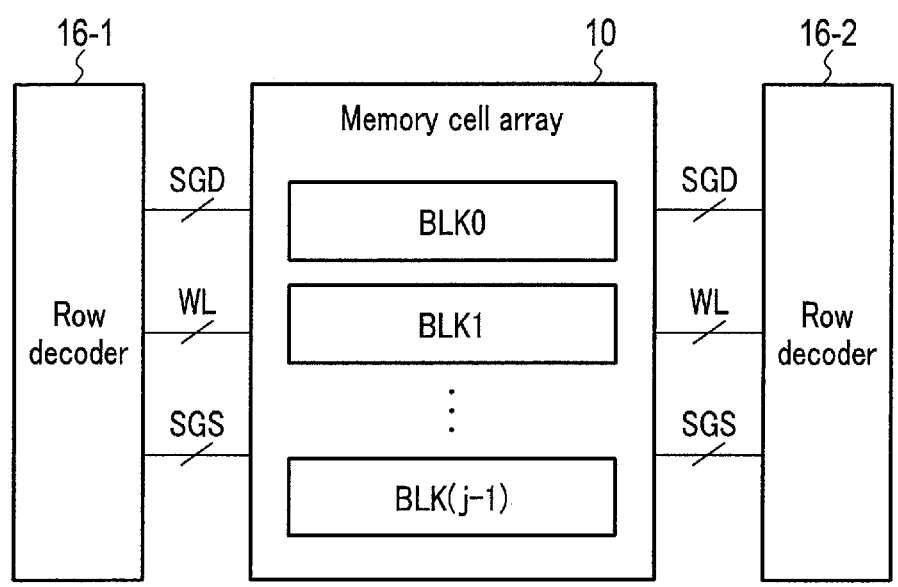
F I G. 9

SEMICONDUCTOR MEMORY DEVICE APPLYING DIFFERENT VOLTAGES TO RESPECTIVE SELECT GATE LINES

CROSS-REFERENCE TO RELATED APPLICATIONS

This application is based upon and claims the benefit of priority from Japanese Patent Application No. 2017-178814, filed Sep. 19, 2017, the entire contents of which are incorporated herein by reference.

FIELD

Embodiments described herein relate generally to a semiconductor memory device.

BACKGROUND

A NAND flash memory is known as a kind of semiconductor memory device. A NAND flash memory comprising three-dimensionally stacked memory cell transistors is also known.

A NAND flash memory comprises NAND strings, and each of the NAND strings comprises memory cell transistors and a select transistor that are serially connected. A word line is connected to a gate of the memory cell transistor, and a select gate line is connected to a gate of the select transistor. When resistance of the select gate line is high, potential of the select gate line floats up due to capacitive coupling with a word line adjacent to the select gate line, during a potential variation of the adjacent word line. Thus, the select transistor can not be normally cut off, and a leak current is generated from a channel of a boosted NAND string. As a result, erroneous writing occurs.

BRIEF DESCRIPTION OF THE DRAWINGS

FIG. 1 is a block diagram of a NAND flash memory according to a first embodiment;

FIG. 3 is a sectional view of a partial area of the block BLK;

FIG. 5 is a schematic diagram showing one example of distributions of threshold voltages of a memory cell transistor;

FIG. 6 is a timing chart illustrating a write operation of the NAND flash memory according to the first embodiment;

FIG. 7 is a timing chart illustrating a write operation of the NAND flash memory according to a modification of the first embodiment;

FIG. 9 is a block diagram illustrating configurations of two row decoders according to a second embodiment;

DETAILED DESCRIPTION

Figure 2:
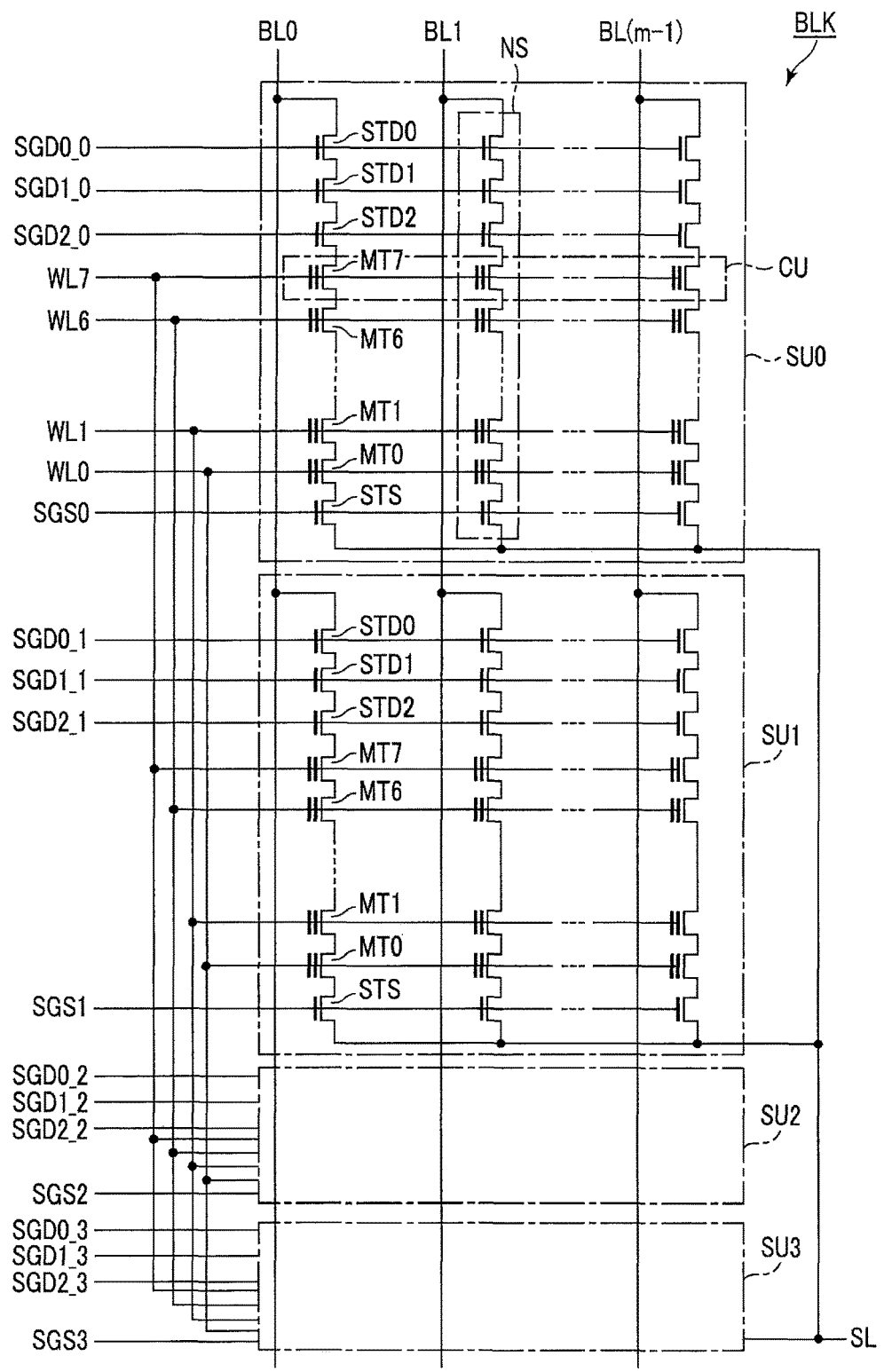
FIG. 2 is a circuit diagram of one block BLK included in a memory cell array.

In general, according to one embodiment, there is provided a semiconductor memory device comprising:
a memory string including first and second select transistors and memory cell transistors which are serially connected in this order;
a bit line connected to the first select transistor;
word lines which are connected to gates of the memory cell transistors, respectively, and which are stacked via insulating layers;
first and second select gate lines which are connected to gates of the first and second select transistors, respectively, and which are stacked on the word lines via insulating layers;
a first contact plug connected to the first select gate line;
a first wiring layer provided on the first contact plug;
a second contact plug connected to the second select gate line;
a second wiring layer provided on the second contact plug; and
a row decoder connected to the first and second wiring layers,
wherein the row decoder is configured to be capable of applying different voltages to the first select gate line and the second select gate line.

Embodiments will now be described with reference to the accompanying drawings. Several embodiments shown below merely exemplify devices and methods that embody the technical concepts of the present invention, and the shapes, structures, layouts, and the like of the components do not limit the technical concepts of the present invention. Each functional block can be obtained as one of hardware and software or a combination of these. It is not necessary for each functional block to be distinguished as in examples below. For example, some functions may be executed by a functional block different from a functional block shown by way of example. Moreover, a functional block shown by way of example may be divided into smaller functional sub-blocks. Note that in the following explanation, the same reference numerals denote elements having the same functions and configurations, and a duplicated explanation will be made only when necessary.

[1] First Embodiment

[1-1] Configuration of Semiconductor Memory Device

FIG. 1 is a block diagram of a semiconductor memory device 1 according to the first embodiment. The semiconductor memory device 1 comprises a NAND flash memory. The NAND flash memory 1 comprises a memory cell array 10, an input/output circuit 11, a logic control circuit 12, a register 13, a control circuit 14, a voltage generator 15, a row decoder 16, a column decoder 17, a sense amplifier unit 18, and a data register (data cache) 19.

The memory cell array 10 comprises j blocks BLK0 to BLK(j−1). j is an integer of 1 or more. Each of the blocks BLK comprises memory cell transistors. The memory cell transistor comprises an electrically rewritable memory cell. In the memory cell array 10, bit lines, word lines, source lines, and others are provided to control a voltage to be applied to the memory cell transistor. A specific configuration of the block BLK will be described later.

The input/output circuit 11 and the logic control circuit 12 are connected to a host device (memory controller) via a NAND bus. The input/output circuit 11 transmits and receives signals DQ (e.g. DQ0 to DQ7) to and from the memory controller via the NAND bus.

The logic control circuit 12 receives external control signals (e.g., a chip enable signal CEn, a command latch enable signal CLE, a address latch enable signal ALE, a write enable signal WEn, a read enable signal REn, and a write protect signal WPn) from the memory controller via the NAND bus. "n" added to a signal name indicates an active row. The logic control circuit 12 also transmits a ready/busy signal R/Bn to the memory controller via the NAND bus.

The signal CEn enables selection of the NAND flash memory 1. The signal CLE enables a command transmitted as the signal DQ to be latched in a command register. The signal ALE enables an address transmitted as the signal DQ to be latched in an address register. The signal WEn enables writing. The signal REn enables reading. The signal WPn inhibits writing and erasing. The signal R/Bn indicates whether the NAND flash memory 1 is in a ready state (a state of being ready to accept an external instruction) or in a busy state (a state of being unready to accept an external instruction). The memory controller can know a state of the NAND flash memory 1 by receiving the signal R/Bn.

The register 13 comprises a command register, an address register, a status register, and others. The command register temporarily holds a command. The address register temporarily holds an address. The status register temporarily holds data necessary to operate the NAND flash memory 1. The register 13 comprises, for example, an SRAM.

The control circuit 14 receives a command from the register 13, and takes overall control of the NAND flash memory 1 in accordance with a sequence based on this command.

The voltage generator 15 receives a power supply voltage from the outside of the NAND flash memory 1, and uses this power supply voltage to generate voltages necessary for a write operation, a read operation, and an erase operation. The voltage generator 15 supplies the generated voltages to the memory cell array 10, the row decoder 16, the sense amplifier unit 18, and the like.

Receiving a row address from the register 13, the row decoder 16 decodes this row address. On the basis of the decoded row address, the row decoder 16 performs an operation of selecting a word line. The row decoder 16 then transfers, to the selected block BLK, the voltages necessary for the write operation, the read operation, and the erase operation.

Receiving a column address from the register 13, the column decoder 17 decodes this column address. On the basis of the decoded column address, the column decoder 17 selects one bit line.

The sense amplifier unit 18 detects and amplifies data read to the bit line from the memory cell transistor, during data reading. Further, the sense amplifier unit 18 transfers write data to the bit line, during data writing. The sense amplifier unit 18 comprises sense amplifiers connected to the bit lines, respectively.

The data register 19 temporarily holds data transferred from the sense amplifier unit 18, and serially transfers the data to the input/output circuit 11, during data reading. Further, the data register 19 temporarily holds data serially transferred from the input/output circuit 11, and transfers the data to the sense amplifier unit 18, during data writing. The data register 19 comprises an SRAM or the like.

[1-1-1] Configuration of Block BLK

FIG. 2 is a circuit diagram of one block BLK included in the memory cell array 10. Each of the blocks BLK comprises string units SU. In FIG. 2, four string units SU0 to SU3 are shown by way of example. Any number of string units SU to be included in one block BLK can be set.

Each of the string units SU comprises NAND strings (memory strings) NS. Any number of NAND strings NS to be included in one string unit SU can be set.

Each of the NAND strings NS comprises memory cell transistors MT, three drain-side select transistors STD, and a source-side select transistor ST. In the present embodiment, the select transistor STD included in one NAND string NS comprises three select transistors STD0 to STD2. In the following explanation, the select transistors STD0 to STD2 are denoted as a select transistor STD unless otherwise needed to be distinguished in particular, and an explanation of the select transistor STD is common to the select transistors STD0 to STD2.

Although one select transistor STS is only shown in FIG. 2 for simplicity, the NAND string NS may comprise more than one select transistor STS. In addition, although the NAND string NS comprises eight memory cell transistors MT (MT0 to MT7) for simplicity in a configuration example shown in FIG. 2, any number of memory cell transistors MT to be provided in the NAND string NS can be set.

The memory cell transistors MT are serially connected between a source of the select transistor STD2 and a drain of the select transistor STS. The memory cell transistor MT comprises a control gate electrode and a charge storage layer, and stores data in a volatile manner. The memory cell transistor MT is capable of storing 1 bit or 2 or more bits of data.

In the string unit SU0, gates of the select transistors STD0 are connected in common to a select gate line SGD0_0, gates of the select transistors STD1 are connected in common to a select gate line SGD1_0, gates of the select transistors STD2 are connected in common to a select gate line SGD2_0. Branch numbers attached to the select gate lines SGD0 to SGD2 signify numbers of the corresponding string units SU. Likewise, select gate lines SGD0_1 to SGD2_1, SGD0_2 to SGD2_2, and SGD0_3 to SGD2_3 are connected to the string units SU1 to SU3, respectively.

Gates of select transistors STS included in the string unit SU0 are connected in common to a select gate line SGS0, and likewise, select gate lines SGS1 to SGS3 are connected to the string units SU1 to SU3, respectively. Gates of select transistors STS in each block BLK may be connected to a common select gate line SGS.

Control gates of the memory cell transistors MT0 to MT7 in each block BLK are connected to word lines WL0 to WL7, respectively.

Drains of the select transistors STD0 of the NAND strings NS in the same column among the NAND strings NS arranged in each block BLK in matrix form are connected in common to one of bit lines BL0 to BL(m−1). "m" is an integer of 1 or more. Further, each bit line BL connects, in common, one NAND string NS in each string unit SU between the blocks BLK. Sources of the select transistors STS included in each block BLK are connected in common to a source line SL. The source line SL connects, in common, the NAND strings NS between the blocks, for example.

Data in the memory cell transistors MT in each block BLK are, for example, collectively erased. Data are collectively read from and written into the memory cell transistors MT connected in common to one word line WL provided in one string unit SU. A set of the memory cell transistors MT having the word line WL in common in one string unit SU is referred to as a cell unit CU. A group of 1-bit data stored in each of the memory cell transistors MT included in the cell unit CU is referred to as a page. That is, a write operation and a read operation for the cell unit CU are performed with the page as a unit.

Note that the NAND string NS may comprise a dummy cell transistor. Specifically, for example, two dummy cell transistors DT0 and DT1 are serially connected between the select transistor STS and the memory cell transistor MT0. For example, two dummy cell transistors DT2 and DT3 are serially connected between the memory cell transistor MT7 and the select transistor STD2. Dummy word lines DWL0 to DWL3 are connected to gates of the dummy cell transistors DT0 to DT3, respectively. The structure of the dummy cell transistor is the same as that of the memory cell transistor. The dummy cell transistor is not intended to store data, and has a function of easing disturbance to which the memory cell transistor and the select transistor are subjected during a write operation or an erase operation.

[1-1-2] Stacked Structure of Block BLK

FIG. 3 is a sectional view of a partial area of the block BLK. An X-direction is a direction in which the select gate line extends, a Y-direction crossing the X-direction in a horizontal plane is a direction in which the bit line extends, a Z-direction is a stacking direction.

The NAND strings NS are provided on a p-type well area 30. That is, a wiring layer 31 functioning as the select gate line SGS, an eight-layer wiring layer 32 functioning as the word lines WL0 to WL7, and a three-layer wiring layer 33 functioning as the select gate lines SGD0 to SGD2 are sequentially stacked on the well area 30. Unshown insulating layers are provided between the stacked wiring layers.

A memory hole 34 reaches the well area 30 through the wiring layers 31, 32, and 33. A pillar-shaped semiconductor layer 35 is provided in the memory hole 34. A gate insulating film 36, a charge storage layer (insulating film) 37, and a block insulating film 38 are provided in this order on a side surface of the semiconductor layer 35. These constitute the memory cell transistor MT, and the select transistors STD and STS. The semiconductor layer 35 functions as a current path of the NAND string NS, and serves as an area where a channel of each transistor is formed. An upper end of the semiconductor layer 35 is connected, via a contact plug 39, to a metal wiring layer 40 functioning as the bit line BL.

An n$^+$-type impurity diffusion layer 41 is provided in a surface area of the well area 30. A contact plug 42 is provided on the diffusion layer 41, and is connected to a metal wiring layer 43 functioning as the source line SL. Further, a p$^+$-type impurity diffusion layer 44 is provided in a surface area of the well area 30. A contact plug 45 is provided on the diffusion layer 44, and is connected to a metal wiring layer 46 functioning as a well wiring line CPWELL. The well wiring line CPWELL is a wiring line intended to apply a voltage to the semiconductor layer 35 via the well area 30.

More than one configuration described above are arrayed in a depth direction (X-direction) of the sheet of FIG. 3, and a group of NAND strings NS arranged in the depth direction constitutes the string unit SU.

[1-1-3] Configuration of Hookup Area

Next, a configuration of a hookup area is described. The hookup area is an area used to connect the select gate line SGS, the word lines WL, and the select gate lines SGD0 to SGD2 that are stacked to the decoder and the like.

Figure 4:
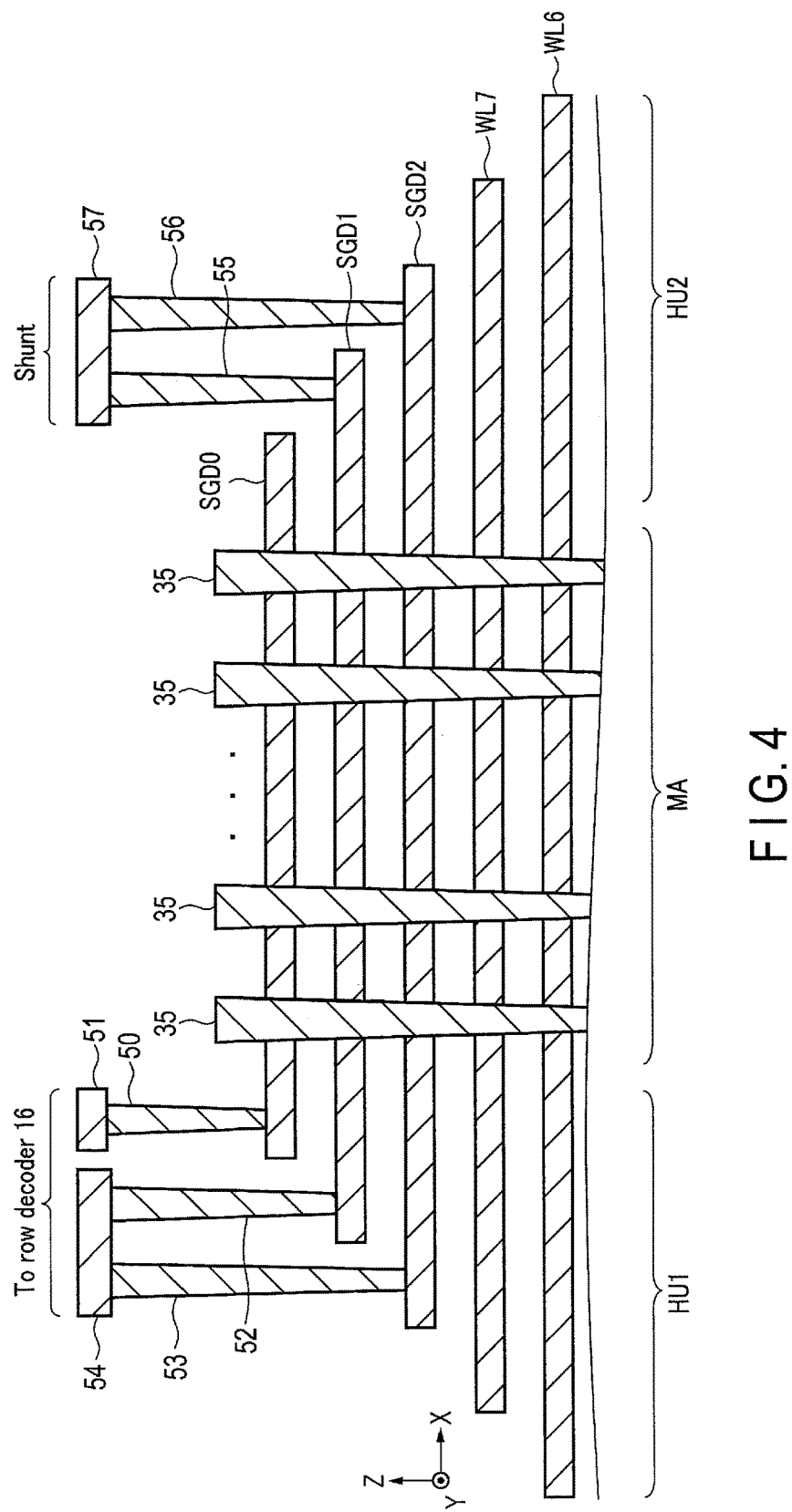
FIG. 4 is a sectional view of hookup areas according to a first embodiment.

FIG. 4 is a sectional view of hookup areas HU1 and HU2. FIG. 4 is a sectional view taken along the X-direction. FIG. 4 mainly shows upper parts of the semiconductor layers (semiconductor pillars) 35. In FIG. 4, the gate insulating film 36, the charge storage layer 37, and the block insulating film 38 provided on the side surface of the semiconductor layer 35 are not shown.

The memory cell array 10 comprises a memory area MA where the semiconductor pillars 35 in which the memory cell transistors MT are formed are arranged, and the hookup areas HU1 and HU2 disposed on the X-direction side of the memory area MA. For example, the row decoder 16 is disposed on the hookup area HU1 side.

In the hookup area HU1, the select gate line SGS, the word lines WL, and the select gate lines SGD0 to SGD2 that are stacked are formed in a stair-like manner. Likewise, in the hookup area HU2, the select gate line SGS, the word lines WL, and the select gate lines SGD0 to SGD2 that are stacked are formed in a stair-like manner.

In the hookup area HU1, a contact plug 50 is provided on the select gate line SGD0, and a wiring layer 51 is provided on the contact plug 50. In the hookup area HU1, a contact plug 52 is provided on the select gate line SGD1, and a wiring layer 54 is provided on the contact plug 52. In the hookup area HU1, a contact plug 53 is provided on the select gate line SGD2, and the wiring layer 54 is provided on the contact plug 53. That is, the select gate line SGD1 and the select gate line SGD2 are electrically connected to each other. The wiring layer 51 and the wiring layer 54 are connected to the row decoder 16.

In the hookup area HU2, a contact plug 55 is provided on the select gate line SGD1, and a shunt wiring layer 57 is provided on the contact plug 55. In the hookup area HU2, a contact plug 56 is provided on the select gate line SGD2, and the shunt wiring layer 57 is provided on the contact plug 56. That is, in the hookup area HU2 on a side far from the row decoder 16, the select gate line SGD1 and the select gate line SGD2 are electrically connected to each other by the shunt wiring layer 57.

Thus, in the present embodiment, the select gate line SGD0 disposed on the bit line BL side is electrically isolated from the select gate lines SGD1 and SGD2. That is, the select gate line SGD0 and the select gate line SGD1 (or SGD2) permit independent voltage control.

[1-1-4] Threshold Distributions of Memory Cell Transistor

Next, distributions of threshold voltages that can be taken by the memory cell transistor MT are described. FIG. 5 is a schematic diagram showing one example of distributions of threshold voltages of the memory cell transistor MT. The memory cell transistor MT is capable of storing 2 or more bits of data. In the present embodiment, the case where the memory cell transistor MT stores 3 bits of data, that is, a triple level cell (TLC) scheme is described by way of example.

The 3-bit data are defined by an upper bit, a middle bit, and a lower bit. When the memory cell transistor MT stores 3 bits, the memory cell transistor MT has one of eight threshold voltages. The eight threshold voltages are referred to as "Er", "A", "B", "C", "D", "E", "F", and "G" levels in ascending order. The memory cell transistors MT belonging to each of the "Er", "A", "B", "C", "D", "E", "F", and "G" levels form distributions.

For example, "111" data, "110" data, "100" data, "000" data, "010" data, "011" data, "001" data, and "101" data are allocated to the threshold distributions of the "Er", "A", "B", "C", "D", "E", "F", and "G" levels, respectively. Any allocation of the data to the threshold distributions can be set.

To identify the data stored in the memory cell transistor MT to be read from, the level to which the threshold voltage of this memory cell transistor MT belongs is determined. Read voltages VA, VB, VC, VD, VE, VF, and VG are used to determine the level.

The "Er" level corresponds to, for example, an erase state of data. In addition, the threshold voltage of the memory cell transistor MT included in the "Er" level is lower than the voltage VA, and has, for example, a negative value.

The "A" level to the "G" level correspond to a state where the charge storage layer is charged and data are thus written in the memory cell transistor MT, and the threshold voltage of the memory cell transistor MT included in each distribution has, for example, a positive value. The threshold voltage included in the "A" level is higher than the read voltage VA, and less than or equal to the read voltage VB. The threshold voltage included in the "B" level is higher than the read voltage VB, and less than or equal to the read voltage VC. The threshold voltage included in the "C" level is higher than the read voltage VC, and less than or equal to the read voltage VD. The threshold voltage included in the "D" level is higher than the read voltage VD, and less than or equal to the read voltage VE. The threshold voltage included in the "E" level is higher than the read voltage VE, and less than or equal to the read voltage VF. The threshold voltage included in the "F" level is higher than the read voltage VF, and less than or equal to the read voltage VG. The threshold voltage included in the "G" level is higher than the read voltage VG, and less than or equal to a voltage VREAD. The voltage VREAD is a voltage which is applied to the word line WL connected to the memory cell transistor MT of the cell unit CU untargeted for reading, and higher than the threshold voltage of the memory cell transistor MT at any level. That is, the memory cell transistor MT in which the voltage VREAD is applied to a control gate comes into an on-state regardless of data to be held therein.

As described above, each memory cell transistor MT can take eight kinds of states by having one of the distributions of the eight threshold voltages. Moreover, data are written and read on a page unit in one cell unit CU. When the memory cell transistor MT stores 3-bit data, the lower bit, the middle bit, and the upper bit are allocated to three pages in one cell unit CU, respectively. Pages collectively written or read for the lower bit, the middle bit, and the upper bit are referred to as a lower page, a middle page, and an upper page, respectively.

[1-2] Operation

Next, an operation of the NAND flash memory 1 having the above configuration is described. FIG. 6 is a timing chart illustrating a write operation of the NAND flash memory 1 according to the first embodiment. FIG. 6 shows voltage waveforms regarding the unselected select gate lines SGD.

The write operation includes a precharge operation and a Vpass raising operation. The precharge operation is an operation in which a channel is precharged to a predetermined voltage. Specifically, in the precharge operation, a write inhibit voltage is transferred to an unselected NAND string. The Vpass raising operation is an operation in which all the word lines WL are raised to a voltage Vpass before an operation of applying a program voltage Vpgm to a selected word line. The voltage Vpass is a voltage which brings the memory cell transistor MT into an on-state regardless of the threshold voltage of the memory cell transistor MT. The voltage Vpgm and the voltage Vpass are in a relation of Vpgm>Vpass.

At a time t0, the row decoder 16 applies a voltage Vsg_pre to the select gate lines SGD0 to SGD2. The voltage Vsg_pre is a voltage which brings the select transistors STD0 to STD2 into an on-state. Accordingly, the select transistors STD0 to STD2 turn on. At the time t0, the row decoder 16 applies a voltage Vwl_pre to all the word lines WL. The voltage Vwl_pre is a voltage which brings the memory cell transistor MT into an on-state regardless of the threshold voltage of the memory cell transistor MT. Alternatively, the voltage Vwl_pre may be a voltage which brings, into an on-state, the drain-side memory cell transistor MT in which no data are written. The voltage Vwl_pre has a relation of Vwl_pre Vpass. Accordingly, all the memory cell transistors MT in the block BLK turn on.

At the time t0, the sense amplifier unit 18 applies a ground voltage Vss (0 V) to the selected bit line BL, and applies a voltage for write inhibition (e.g. a power supply voltage Vdd) to the unselected bit line BL. A select transistor SGS is in an off-state. As a result, the power supply voltage Vdd is transferred to the channel in the NAND string connected to the unselected bit line BL. On the other hand, the ground voltage Vss is transferred to the channel in the NAND string connected to the selected bit line BL.

At a time t1, the row decoder 16 applies the voltage Vsg_pre to the select gate line SGD0, and applies the ground voltage Vss to the select gate lines SGD1 and SGD2. Accordingly, the select transistor STD0 maintains the on-state, and the select transistors STD1 and STD2 turn off. At the time t1, the row decoder 16 applies the ground voltage Vss to all the word lines WL.

Note that broken lines in FIG. 6 indicate a voltage at an end of the select gate line SGD on a side far from the row decoder 16. At the end of the select gate line SGD on the side far from the row decoder 16, dropping of the voltage of the select gate line SGD is slower due to resistance of the select gate line SGD and the like.

At a time t2, the row decoder 16 applies the ground voltage Vss to the select gate line SGD0. At the time t2, the row decoder 16 applies the voltage Vpass to all the word lines WL. Accordingly, all the memory cell transistors MT in the block BLK turn on. In an unselected NAND string, the voltage of the channel is boosted.

In the present embodiment, the voltage of the select gate line SGD is dropped at a raising timing of the voltage of the word line WL. This makes it possible to inhibit the voltages of the select gate lines SGD1 and SGD2 from rising due to capacitive coupling between the select gate line SGD2 and the word line WL adjacent to the select gate line SGD2. That is, cut-off characteristics of the select transistors STD0 to STD2 can be improved. Therefore, in an unselected NAND string, generation of a leak current from a boosted channel can be inhibited.

Thereafter, the program voltage Vpgm is applied to the selected word line WL, and the voltage Vpass is kept applied to the unselected word line WL. Note that a voltage Vsg is applied to the selected select gate lines SGD (SGD0 to SGD2). The voltage Vsg is a voltage lower than the voltage Vsg_pre, and is a voltage that turns on the select transistor STD to which the ground voltage Vss is applied but cuts off the select transistor STD to which the power supply voltage Vdd is applied. Accordingly, in a selected NAND string, a potential difference between the selected word line WL and the channel increases, and an electron is injected to the charge storage layer of the selected memory cell transistor MT. On the other hand, in an unselected NAND string, a potential difference between the selected word line WL and the channel does not increase, and the threshold voltage of the memory cell transistor MT is maintained.

[1-3] Modification

Next, a write operation according to a modification of the first embodiment is described. FIG. 7 is a timing chart illustrating a write operation of the NAND flash memory 1 according to the modification of the first embodiment.

At a time t1, the row decoder 16 brings the select gate line SGD0 into a floating state. Accordingly, the select gate line SGD0 is kept substantially at the voltage Vsg_pre.

At a time t2, the row decoder 16 applies the ground voltage Vss to the select gate line SGD0. This makes it possible to inhibit the voltages of the select gate lines SGD1 and SGD2 from rising.

In the modification, there is no need to prepare an additional power supply during a period t1 to t2. This makes it possible to simplify a power-supply-related circuit configuration, and makes voltage control of the select gate line SGD0 easier.

[1-4] Comparative Example

Figure 8:
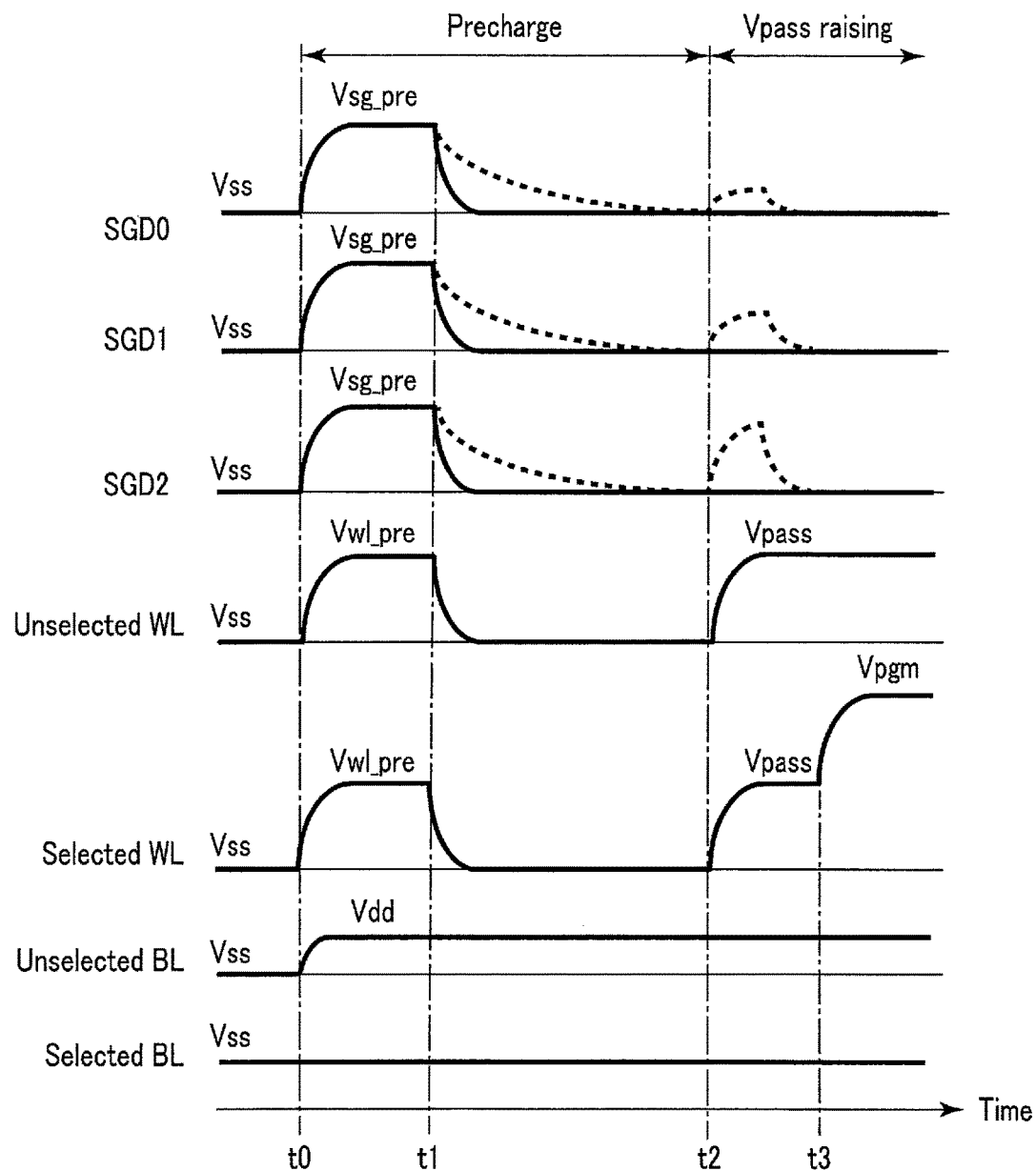
FIG. 8 is a timing chart illustrating a write operation according to a comparative example.

Next, a comparative example is described. FIG. 8 is a timing chart illustrating a write operation according to the comparative example. In the comparative example, voltage control of the select gate lines SGD0 to SGD2 is the same. For example, the select gate lines SGD0 to SGD2 are electrically connected to one another.

At a time t1, the ground voltage Vss is applied to the select gate lines SGD0 to SGD2.

At a time t2, the voltage Vpass is applied to all the word lines WL. At this point, the voltage of the select gate line SGD2 rises (floats up) due to capacitive coupling between the select gate line SGD2 and the word line WL adjacent to the select gate line SGD2. The voltage of the select gate line SGD1 also rises due to capacitive coupling between the select gate line SGD2 and the select gate line SGD1. Likewise, the voltage of the select gate line SGD0 also rises due to capacitive coupling between the select gate line SGD1 and the select gate line SGD0. In particular, as indicated by broken lines in FIG. 8, the voltage of the select gate line SGD2 considerably rises at the end of the select gate line SGD2 on the side far from the row decoder 16.

In this case, cutting-off of the select transistors STD1 and STD2 weakens, and leak currents are generated from the select transistors STD1 and STD2. Thus, in an unselected NAND string, a boosted channel voltage decreases, and erroneous writing can occur.

[1-5] Advantageous Effects of First Embodiment

As described above in detail, in the first embodiment, for example, three select transistors STD0 to STD2 are serially connected between the bit line BL and the word line WL. The select gate lines SGD0 to SGD2 are connected to the gates of the select transistors STD0 to STD2, respectively. The select gate line SGD0 and the select gate line SGD1 (and SGD2) permit independent voltage control, and the row decoder 16 can apply different voltages to the select gate line SGD0 and the select gate line SGD1 (and SGD2). In addition, the row decoder 16 drops the voltage of the select gate line SGD0 at a raising timing of the voltages of the word lines WL.

Therefore, according to the first embodiment, it is possible to inhibit the voltages of the select gate lines SGD1 and SGD2 from rising (floating up) due to capacitive coupling with the adjacent word line WL. Thus, the cut-off characteristics of the select transistors STD0 to STD2 can be improved, so that generation of a leak current from a boosted channel in an unselected NAND string can be inhibited. This makes it possible to inhibit erroneous writing in an unselected NAND string, and thus improve reliability of the NAND flash memory 1.

[2] Second Embodiment

FIG. 9 is a block diagram illustrating configurations of two row decoders 16-1 and 16-2 according to a second embodiment. Configurations other than the row decoders 16-1 and 16-2 are the same as those in the first embodiment.

The NAND flash memory 1 comprises the two row decoders 16-1 and 16-2. The row decoders 16-1 and 16-2 are disposed on both sides of the memory cell array 10. The row decoders 16-1 and 16-2 are connected to the select gate lines SGD, the word lines WL, and the select gate lines SGS, respectively. The row decoders 16-1 and 16-2 execute the same voltage control.

Figure 10:
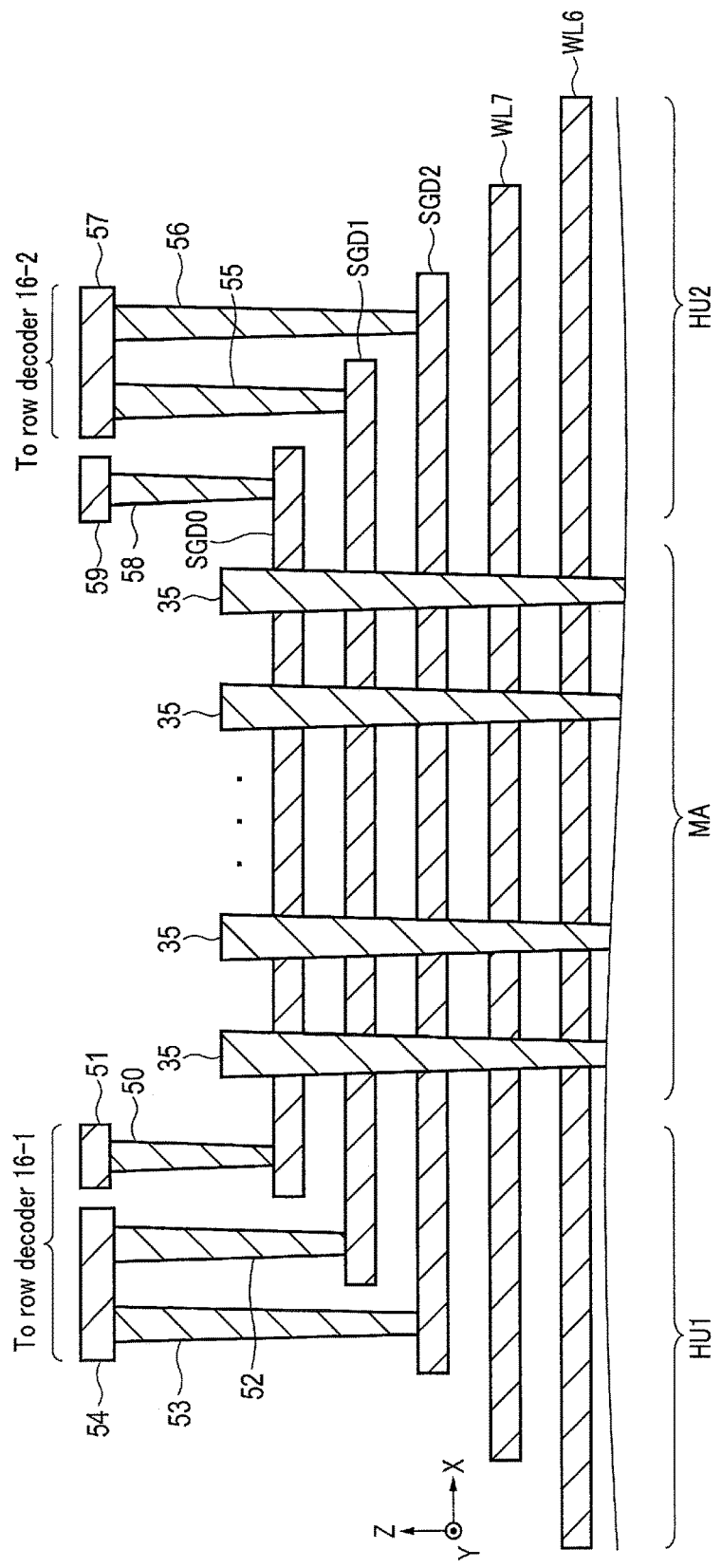
FIG. 10 is a sectional view of the hookup areas according to the second embodiment.

FIG. 10 is a sectional view of hookup areas HU1 and HU2. The row decoder 16-1 is disposed on the hookup area HU1 side, and the row decoder 16-2 is disposed on the hookup area HU2 side.

In the hookup area HU1, the wiring layer 51 and the wiring layer 54 are connected to the row decoder 16-1.

In the hookup area HU2, a contact plug 58 is provided on the select gate line SGD0, and a wiring layer 59 is provided on the contact plug 58. The wiring layer 57 and the wiring layer 59 are connected to the row decoder 16-2.

In the second embodiment, voltages of the select gate lines SGD, the word lines WL, and the select gate lines SGS can be controlled from both sides of the memory cell array 10. A write operation according to the second embodiment is the same as the write operation according to the first embodiment. The second embodiment is particularly advantageous when the resistance of the select gate line SGD is higher and when the size of the memory cell array is larger. Other advantageous effects are similar to those according to the first embodiment.

[3] Third Embodiment

[3-1] Configuration of Memory Cell Array 10

Figure 11:
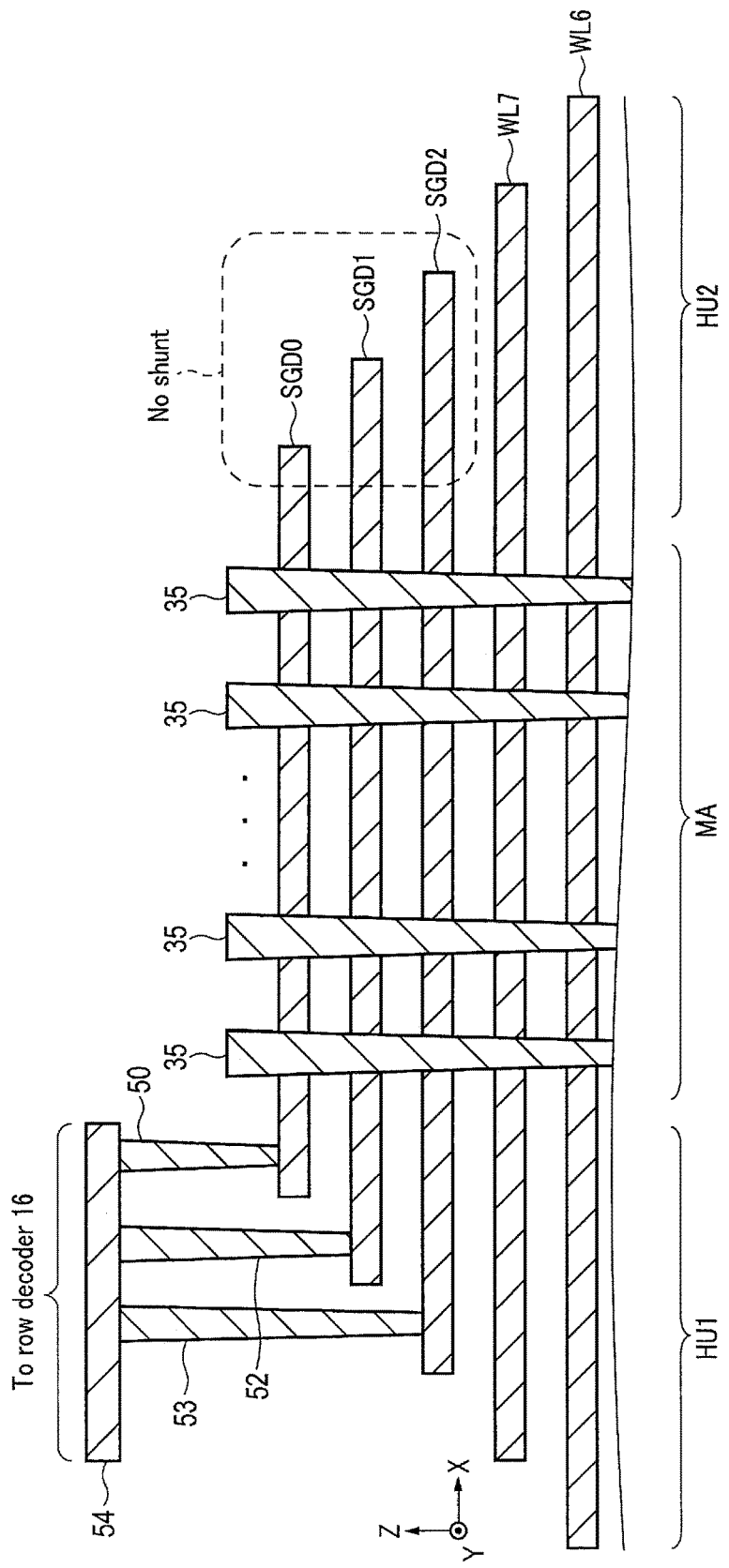
FIG. 11 is a sectional view of the hookup areas according to a third embodiment.

FIG. 11 is a sectional view of the hookup areas HU1 and HU2 according to the third embodiment.

In the hookup area HU1, the contact plug 50 is provided on the select gate line SGD0, the contact plug 52 is provided on the select gate line SGD1, and the contact plug 53 is provided on the select gate line SGD2. The wiring layer 54 is provided on the contact plugs 50, 52, and 53. That is, in the hookup area HU1, the select gate lines SGD0 to SGD2 are electrically connected to one another by the wiring layer 54. The wiring layer 54 is connected to the row decoder 16. The row decoder 16 executes the same voltage control over the select gate lines SGD0 to SGD2.

In the hookup area HU2 on the side far from the row decoder 16, the select gate lines SGD0 to SGD2 are electrically isolated from one another, that is, are not shunted to one another.

[3-2] Operation

Next, a write operation of the NAND flash memory 1 having the above configuration is described. A basic operation is the same as that in FIG. 6. In a precharge operation included in the write operation, the row decoder 16 applies the voltage Vsg_pre to the select gate lines SGD0 to SGD2, and precharges the channel of the NAND string. The row decoder 16 then applies the ground voltage Vss to the select gate lines SGD0 to SGD2. That is, the select gate lines SGD0 to SGD2 undergo the same voltage control as the select gate lines SGD1 and SGD2 in FIG. 6.

Further, in a Vpass raising operation (at a time t2 in FIG. 6), the row decoder 16 applies the voltage Vpass to all the word lines WL. Accordingly, in an unselected NAND string, the voltage of the channel is boosted.

Figure 12:
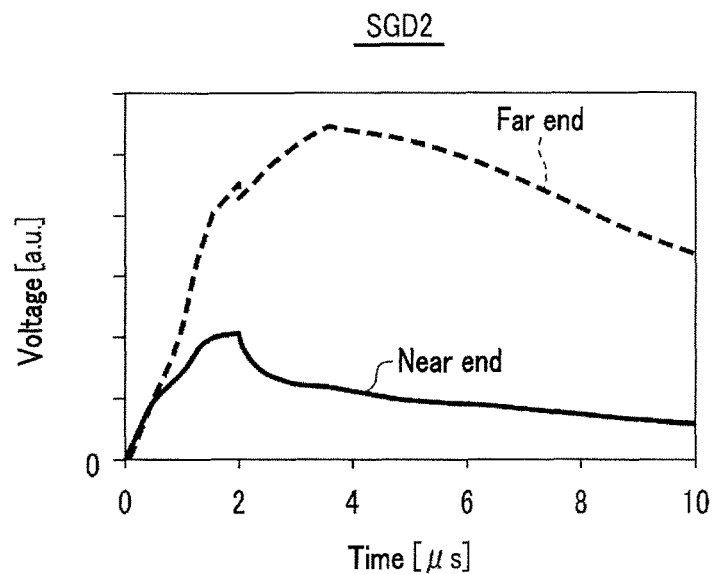
FIG. 12 is a graph illustrating voltage waveforms of a select gate line SGD2 according to the third embodiment.
Figure 13:
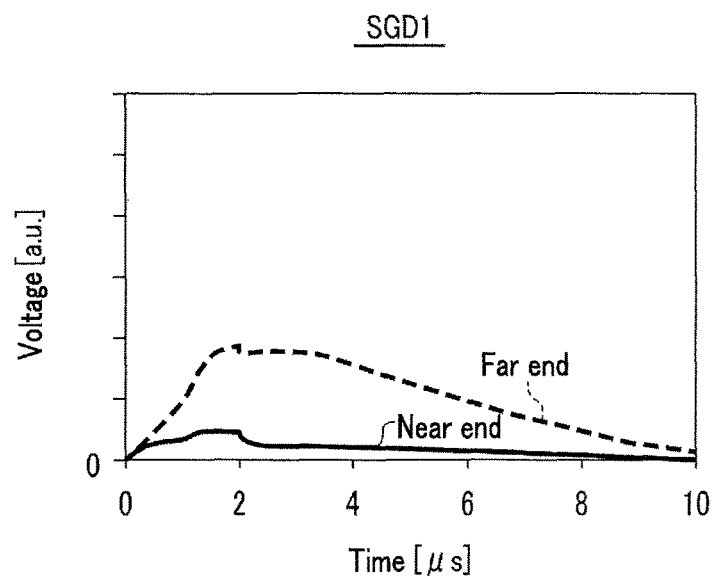
FIG. 13 is a graph illustrating voltage waveforms of a select gate line SGD1 according to the third embodiment.

FIG. 12 is a graph illustrating voltage waveforms of the select gate line SGD2 closest to the word line WL. FIG. 13 is a graph illustrating voltage waveforms of the select gate line SGD1 adjacent to the select gate line SGD2. A vertical axis in FIG. 12 indicates the voltage (any unit: a.u.) of the select gate line SGD2, and a horizontal axis in FIG. 12 indicates time (μs). The end of the select gate line SGD2 on the side far from the row decoder 16 is referred to as a "far end", and the end of the select gate line SGD2 on the side near the row decoder 16 is referred to as a "near end". A time zero in FIG. 12 corresponds to a timing of raising the word line WL to Vpass. FIG. 13 is also a graph similar to that in FIG. 12.

As shown in FIG. 12, the select gate line SGD2 is considerably affected by capacitive coupling with the adjacent word line WL. At the far end of the select gate line SGD2 in particular, the voltage of the select gate line SGD2 significantly rises.

Herein, the select gate lines SGD0 to SGD2 are not shunted at the near ends thereof. Therefore, as shown in FIG. 13, at the near end of the select gate line SGD1, rising of the voltage of the select gate line SGD1 can be inhibited. Moreover, the select gate line SGD0 is farther from the word line WL, so that rising of the voltage of the select gate line SGD0 can be further inhibited.

In the present embodiment, the cut-off characteristics of the select transistor STD2 closest to the word line WL deteriorate. However, the cut-off characteristics of the select transistors STD0 and STD1 can be improved. As a result, leak currents can be inhibited in the select transistors STD0 to STD2 as a whole.

[3-3] Modification

Figure 14:
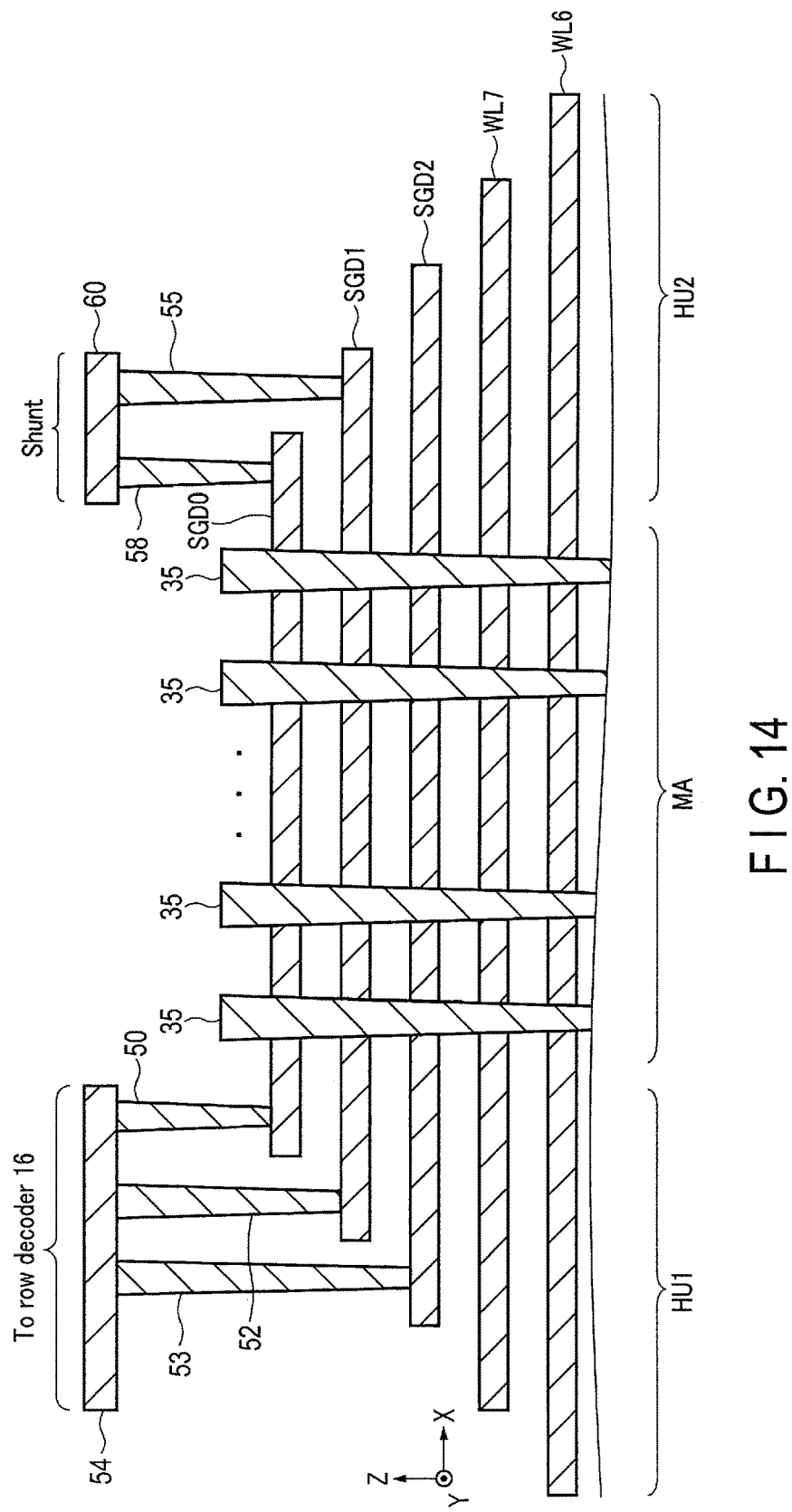
FIG. 14 is a sectional view of the hookup areas according to a modification of the third embodiment.

Next, a modification of the third embodiment is described. FIG. 14 is a sectional view of the hookup areas HU1 and HU2 according to a modification of the third embodiment.

In the hookup area HU2, the contact plug 58 is provided on the select gate line SGD0, and the contact plug 55 is provided on the select gate line SGD1. A shunt wiring layer 60 is provided on the contact plugs 55 and 58. That is, in the hookup area HU2, the select gate line SGD0 and the select gate line SGD1 are electrically connected to each other by the shunt wiring layer 60.

In the modification as well, rising of the voltages of the select gate lined SGD0 and SGD1 can be inhibited. As a result, leak currents can be inhibited in the select transistors STD0 to STD2 as a whole.

[3-4] Comparative Example

Figure 15:
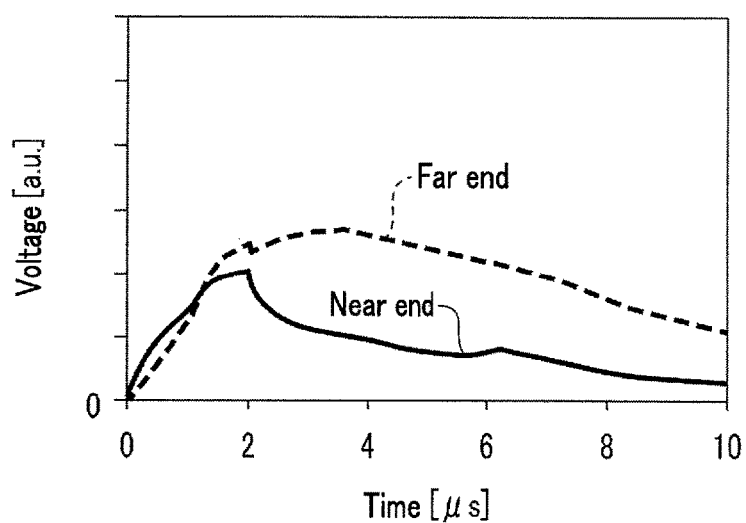
FIG. 15 is a graph illustrating voltage waveforms of the select gate line SGD2 according to a comparative example.

Next, a comparative example is described. FIG. 15 is a graph illustrating voltage waveforms of the select gate line SGD2 according to the comparative example. In the comparative example, the select gate lines SGD0 to SGD2 are shunted at the near ends thereof.

As shown in FIG. 15, the voltage of the select gate line SGD2 rises at the timing of raising the word lines WL to the voltage Vpass. Moreover, because the select gate lines SGD0 to SGD2 are shunted, the select gate lined SGD0 and SGD1 have substantially the same voltage waveform as the select gate line SGD2. Therefore, in the comparative example, leak currents are higher in the select transistors STD0 to STD2 as a whole.

[3-5] Advantageous Effects of Third Embodiment

As described above in detail, in the third embodiment, for example, three select transistors STD0 to STD2 are serially connected between the bit line BL and the word line WL. The select gate lines SGD0 to SGD2 are connected to the gates of the select transistors STD0 to STD2, respectively. The select gate lines SGD0 to SGD2 are connected to the row decoder 16 at a first end. Moreover, the select gate lines SGD0 to SGD2 are electrically isolated from one another at a second end (an end on the hookup area HU2 side) opposite to the first end (an end on the hookup area HU1 side) across the NAND strings NS. In addition, the row decoder 16 applies the same voltage to the select gate lines SGD0 to SGD2.

Therefore, according to the third embodiment, it is possible to inhibit the voltages of the select gate lines SGD0 and SGD1 located apart from the word line WL from rising when the word line WL rises to the voltage Vpass. Thus, the cut-off characteristics of the select transistors STD0 and STD1 can be improved. This makes it possible to inhibit erroneous writing in an unselected NAND string, and thus improve reliability of the NAND flash memory 1.

Note that in each of the embodiments described above, the memory cell array 10 comprises three select gate lines SGD0 to SGD2. However, without being limited thereto, the memory cell array 10 may comprise two select gate lines SGD0 and SGD1, and the select gate lines SGD0 and SGD1 may be under independent voltage control. Alternatively, four or more select gate lines SGD may be provided.

Although a MONOS film is used for the memory cell in the examples described above in the embodiments, the memory cell is not limited thereto. For example, a floating gate type memory cell may be used.

In the present specification, "connection" means electric connection, and for example, intervention of an additional element between two connected elements is not excluded.

While certain embodiments have been described, these embodiments have been presented by way of example only, and are not intended to limit the scope. Indeed, the novel embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

The invention claimed is:

1. A semiconductor memory device comprising:
a memory string including first and second select transistors and memory cell transistors which are serially connected in this order;
a bit line connected to the first select transistor;
word lines which are connected to gates of the memory cell transistors, respectively, and which are stacked via insulating layers;
first and second select gate lines which are connected to gates of the first and second select transistors, respectively, and which are stacked on the word lines via insulating layers;
a first contact plug connected to the first select gate line;
a first wiring layer provided on the first contact plug;
a second contact plug connected to the second select gate line;
a second wiring layer provided on the second contact plug; and
a row decoder connected to the first and second wiring layers,
wherein the row decoder is configured to be capable of applying different voltages to the first select gate line and the second select gate line,
at a first time, the row decoder applies a first voltage to the first and second select gate lines, and applies a second voltage to the word lines,
at a second time, the row decoder applies a ground voltage to the second select gate line and the word lines, and
at a third time, the row decoder applies the ground voltage to the first select gate line, and applies a third voltage to the word lines.

2. The device according to claim 1, wherein
the row decoder drops a voltage of the first select gate line at a raising timing of voltages of the word lines.

3. The device according to claim 1, wherein
at a fourth time, the row decoder applies a write voltage higher than the third voltage to a selected word line.

4. The device according to claim 1, further comprising:
a third select transistor connected between the second select transistor and the memory cell transistors; and
a third select gate line which is connected to a gate of the third select transistor and which is provided between the word lines and the second select gate line via an insulating layer,
wherein the row decoder applies the same voltage as that of the second select gate line to the third select gate line.

5. The device according to claim 4, wherein
at the first time, the row decoder applies the first voltage to the first to third select gate lines, and applies the second voltage to the word lines,
at the second time, the row decoder applies the ground voltage to the second and third select gate lines and the word lines, and
at the third time, the row decoder applies the ground voltage to the first select gate line, and applies the third voltage to the word lines.

6. The device according to claim 5, wherein
at a fourth time, the row decoder applies a write voltage higher than the third voltage to a selected word line.

7. The device according to claim 4, further comprising:
a third contact plug connected to the second select gate line:
a fourth contact plug connected to the third select gate line; and
a third wiring layer provided on the third contact plug and the fourth contact plug.

* * * * *